United States Patent [19]

Borden

[11] 4,278,473
[45] Jul. 14, 1981

[54] MONOLITHIC SERIES-CONNECTED SOLAR CELL

[75] Inventor: Peter G. Borden, Menlo Park, Calif.

[73] Assignee: Varian Associates, Inc., Palo Alto, Calif.

[21] Appl. No.: 69,462

[22] Filed: Aug. 24, 1979

[51] Int. Cl.$^3$ .......................................... H01L 31/04
[52] U.S. Cl. ..................................... 136/249; 29/572
[58] Field of Search ........................ 136/89 MS, 89 P; 29/572

[56] References Cited

U.S. PATENT DOCUMENTS

| 3,151,379 | 10/1964 | Escoffery | 29/572 |
| 3,527,619 | 9/1970 | Miley | 136/89 |
| 4,062,698 | 12/1977 | Blakeslee et al. | 136/89 PC |
| 4,156,309 | 5/1979 | Routh et al. | 29/572 |

FOREIGN PATENT DOCUMENTS 1010476 11/1965 United Kingdom .............. 136/89 MS Primary Examiner—Aaron Weisstuch
Attorney, Agent, or Firm—Stanley Z. Cole; Norman E. Reitz

[57] ABSTRACT

A monolithic series-connected solar cell comprises a series of cells each having a mesa-like structure which is electrically interconnected from the top of each cell to a contact ledge formed in the base region of the adjoining cell. The individual cells are supported on an insulating substrate. The monolithic series-connected solar cell is fabricated from a fully formed single junction solar cell by forming a series of breaks down to an insulating substrate, forming a contact ledge in the base region on one side of the mesa defined by each break, applying a layer of insulating material along the opposite side of each mesa and forming a conductive lead between the top region of individual cells and the contact ledge of the adjoining cell.

10 Claims, 13 Drawing Figures

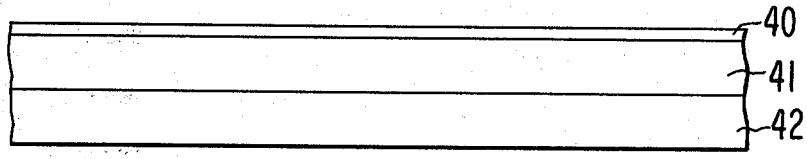
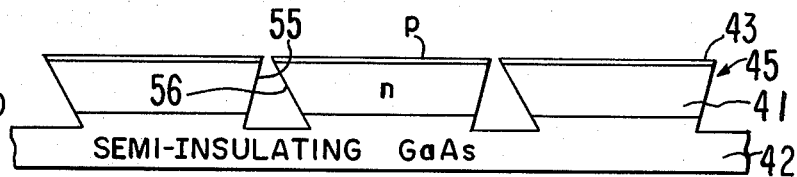
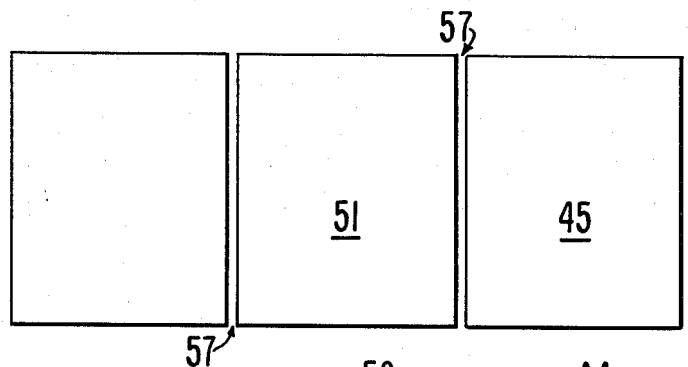
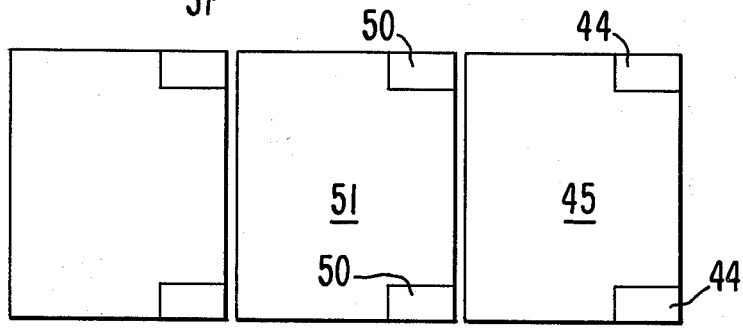
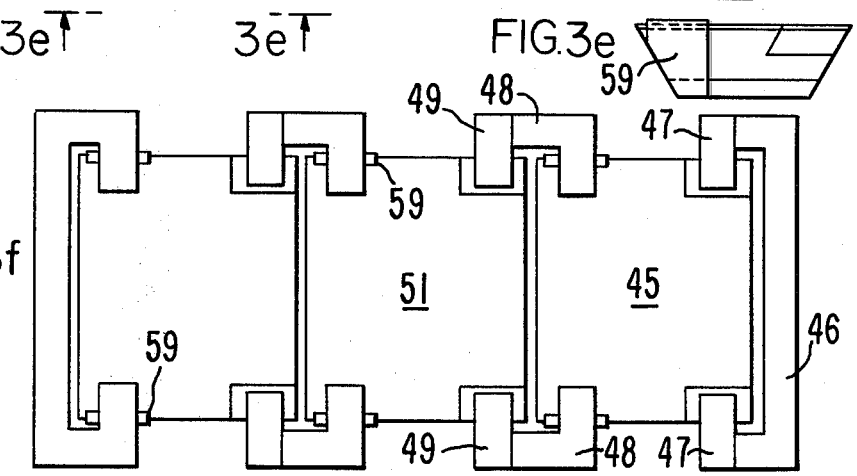

MONOLITHIC SERIES-CONNECTED SOLAR CELL

DESCRIPTION

This invention is related to a monolithic series-connected solar cell fabricated in a semiconductor material and, more particularly, to a high voltage monolithic series-connected solar cell fabricated with low temperature processes.

Photovoltaic devices inherently have low voltage, high current characteristics. The open circuit voltage can easily be determined in theory and measured in practice. For example, for silicon a typical open circuit voltage is 0.57 volts whereas with GaAs a typical open circuit voltage is 0.9 volts. See H. T. Hovel, Solar Cells, Semiconductors and Semimetals Series Vol. 11 (1975) p. 90. The power produced by a given device is proportional to the area, efficiency, series resistance and other factors. Thus, since most electrical power requirements are for voltages on the order of five volts dc for integrated circuitry, or higher voltages for electric motors, electric lights, and the like, it is necessary either to employ a dc-to-dc converter or to connect photovoltaic devices in series to produce useful voltages. Photovoltaic arrays which contain solar sells connected in series are expensive to assemble, are not highly reliable since each interconnection is subject to degradation, require greater surface area, and device performance is limited by the least efficient cell. In concentrator configurations solar cells connected in series also suffer from additional tracking and focusing problems and require heavy bus connectors to handle high currents.

The deficiences recited above for series-connected photovoltaic arrays can be overcome if a number of solar cells are fabricated and interconnected in a monolithic manner in a single device. A number of monolithic series-connected cell structures have been proposed and fabricated. These structures have involved the use of dielectric isolation technology (R. M. Warner, Jr., "Photovoltaic Semi-conductor Devices", U.S. Pat. No. 3,994,012, R. M. Warner, Jr., et al., "A Monolithic Series-Array Solar Battery", 13th IEEE Photovoltaic Specialists Conference Record (1978), p. 1116 et seq.); etching of grooves in a common semiconductor material with subsequent device processing, [R. I. Frank, et al., "Performance of a New High Intensity Silicon Solar Cell", Appl. Phys. Lett., V. 34 (1), p. 65, et seq. (1979), R. Kaplow, et al., U.S. Pat. Nos. 4,110,122, 4,128,732 and 4,131,984); utilizing a silicon wafer adhered to a glass substrate which is etched and subsequently processed, T. I. Chappell, "The V-Groove Multijunction Solar Cell", 13th IEEE Specialists Conference Record, p. 791, et seq. (1979)], T. I. Chappell, IEEE Trans. Electron Devices, No. 7, July 1979, p. 1091; junction isolations, (S. I. Wada, et al., "Solar Battery and Method of Manufacture", U.S. Pat. No. 4,144,096; and three dimensional monolithic cells of the vertical multijunction or horizontal multijunction type. (See e.g., H. J. Hovel, "Novel Materials and Devices for Sunlight Concentrating Systems", IBM J. Res. Development, V. 22, No. 2, March 1978, 112, 117, et seq.) The principal objective of these approaches, as recited previously, has been to obtain a reliable high voltage cell. In addition, such a cell would be useful for concentrator applications where high sunlight intensities are encountered because array tracking error and focusing problems are greatly reduced and smaller diameter and lighter weight bus connectors significantly reduce costs. A common feature of these approaches is that processing of the individual cells, i.e., formation of the p-n junction, occurs subsequent to the structural definition of the individual cells. This limits the use of III-V materials for such monolithic cells since thermal oxide masking is not readily available and thermal diffusion of impurities occurs at temperatures in excess of 700° C. When processing occurs at elevated temperatures the electronic properties of the cell are subject to degradation due to gratuituous thermally caused impurity migration and the semiconductor material itself is subject to decomposition.

It is therefore an object of the present invention to provide a fabrication sequence for producing a monolithic series-connected solar cell which employs low temperature processing steps.

It is an additional object of the present invention to provide a fabrication sequence for producing a monolithic series-connected solar cell in any semiconductor material that may be formed on an insulating substrate such as III-V compounds, II-VI compounds, silicon, germanium, and the like.

It is another object of the present invention to provide a structure for an individual solar cell to be included in a monolithic series-connected device.

It is a still further object of the present invention to exploit the highly developed art of single junction cells by using fully formed single junction cells as starting material for the fabrication sequence for producing a monolithic series-connected solar cell.

SUMMARY OF THE INVENTION

A monolithic series-connected solar cell is fabricated by selecting a fully formed single junction solar cell, forming a series of breaks down to an insulating substrate, forming a contact ledge in the base region on one side of the mesa defined by each break, applying a layer of insulating material along the opposite side of each mesa and forming a conductive lead between the top region of each cell and the contact ledge of the adjoining cell. A monolithic series-connected solar cell comprises a series of cells each having a mesa-like structure which are interconnected from the top of each cell to the contact ledge of the adjoining cell; external connections are made to the top region of the cell on one end to the top region of the cell on the other end of the series.

BRIEF DESCRIPTION OF THE DRAWINGS

For a more complete understanding of the fabrication technique and individual cell structure of the present invention, reference may be had to the accompanying drawings which are incorporated herein by reference and in which:

FIGS. 1-a-1-e are a series of side cross-sectional views of the fabrication sequence of the present invention in which:

FIG. 1-a illustrates the starting material, a single junction solar cell fully formed on an insulating substrate;

FIG. 1-b illustrates the step of forming breaks between cells down to the insulating substrate;

FIG. 1-c illustrates the step of forming a contact ledge on one side of individual cells;

FIG. 1-d illustrates the step of applying an insulating layer down the side of the cells opposite to the contact ledges;

FIG. 1-e illustrates the step of forming a conducting lead from the top side of an individual cell over the insulating layer formed in the step illustrated in FIG. 1-d and onto the contact ledge formed in the step illustrated in FIG. 1-c.

FIGS. 3-a–3-f are a series of side and plan views of the fabrication sequence of an alternate embodiment of the present invention in which:

FIG. 3-a is a side view of the starting material, a single junction solar cell fully formed on an insulating substrate;

FIG. 3-b illustrates the step of forming breaks between cells down to the substrate;

FIG. 3-c is a plan view of the individual cells as defined in FIG. 3b;

FIG. 3-d is a plan view of the individual cell, with the contact ledges formed in the ends of the cells;

FIG. 3-e is a partial side view of FIG. 3-d illustrating a single contact ledge;

FIG. 3-f is a plan view of FIG. 3-d after electrical interconnection by application of conductive metal leads.

DESCRIPTION OF THE PREFERRED EMBODIMENTS

Figure 1A:
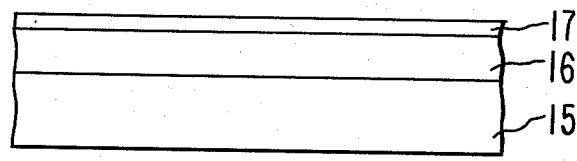
Figure 1B:
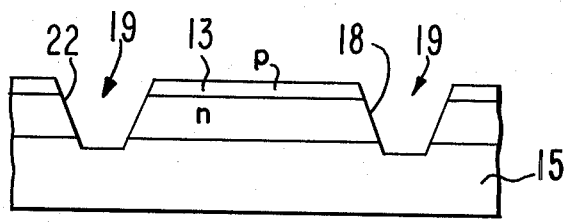
Figure 1C:
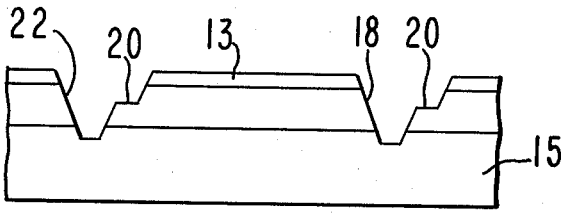

The fabrication technique of the present invention eliminates high temperature processing steps. To accomplish this objective, the starting material for the fabrication sequence is selected to be a single junction fully formed solar cell. The phrase "fully formed" in this specification is used to mean a sequence of semiconductor layers which is capable of functioning as a solar cell but does not yet have electrical contact layers applied. The formation of individual cells and the application of contacts is carried out in accordance with the fabrication sequence of the present invention by low temperature processes. By high temperature in the specification is meant temperatures at which the semiconductor material begins to decompose or at which gratuitous diffusion becomes significant; for example, with gallium arsenide this temperature is about 700° C. The employment of fully formed solar cells on insulating substrates is a feature of the present invention. The fully formed solar cells may bear an epitaxial relationship with the substrate or may be microscopically adhered to the substrate. Thus, for example, an AlGaAs/GaAs solar cell on a semi-insulating GaAs substrate similar to that disclosed in H. A. VanderPlas et al., "Performance of AlGaAs/GaAs Terrestrial Concentrator Solar Cells", 13th Photovoltaic Specialists Conference Record, p. 934 et seq., (1978), is especially suitable; also, a fully formed solar cell in silicon on sapphire would be useful. The presence of the insulating substrate eliminates the need for additional substrate materials. Alternatively, as shown, for example, in T. I. Chappel, supra, a standard silicon cell could be mounted on glass or other suitable substrate. Also, junction isolation may be used as shown in S. Wada, supra. In any event, in accordance with the present invention a fully formed solar cell is employed as the starting material.

Photovoltaic devices by their nature have a planar configuration in order to provide an area for receiving sunlight. For a monolithic series-connected device having a plurality of individual cells, it is necessary for the top side of a given cell to be electrically connected with the bottom side of the base region of an adjacent cell. To enhance efficiency it is desirable to minimize the area required for interconnection. Yet if the break between cells is reduced in order to maximize the receiving data then the interconnection becomes progressively more difficult and potentially less reliable due to the need to lay continuous conductive lines from the top side of a given cell into the break to contact an adjacent cell. The presence of a poor contact would, at least, result in increased series resistance and lowered efficiency and, at worst, an open contact could render the cell inoperative. Thus, it is highly important to consistently achieve high quality cell-to-cell contacts. It has been formed that a contact ledge 20, shown in FIG. 1-e formed on one side of the mesa of each cell permits a positive contact to be made to the base of that cell. Conductive lead 14 extends from one edge of the top layer 12 of individual cell 23 down into the break between cells 23 and 24, across the semi-insulating substrate 15 and up the side 9 of base region 18 of individual cell 23 until it extends over onto contact ledge 20 and terminates thereon. The termination of lead 14 on contact ledge 20 can be carefully controlled so that it does not contact the edge of the adjacent layer 13. The existence of the contact ledge provides a horizontal distance along which a termination point can consistently be determined within the resolution obtainable by photolithography. If a contact ledge were not provided it would be difficult to define a termination point for lead 14 part of the way up a nearly vertical sidewall. Thus, one would be trying to make adequate ohmic contact of lead 14 to epitaxial layer 18 (the base region of cell 24) without having lead 14 ride up the sidewall 9 and contact layer 13 thereby short circuiting cell 24. Such a process step, one without a contact ledge, would be difficult to control. In absolute dimensions the contact ledge 20 need not be wide; dimensions on the order of 15 microns are suitable. The resultant monolithic solar cells can have very high active areas. Thus, a minimum width break can be utilized between cells, providing that a positive contact is made by means of the contact ledge 20.

Figure 2:
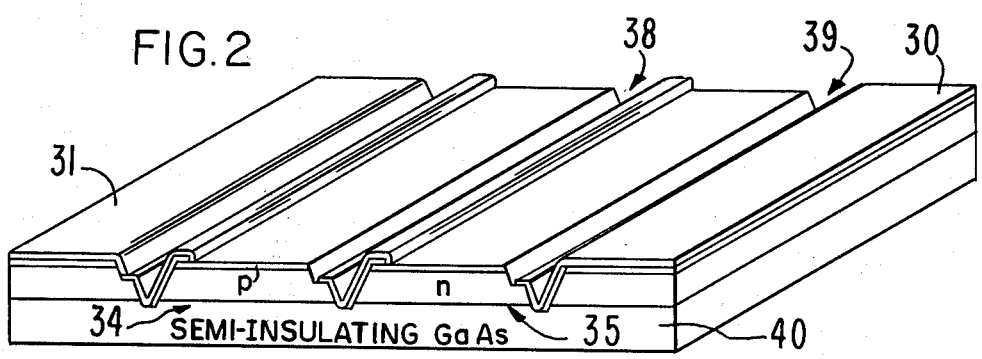
FIG. 2 is a top perspective view of the monolithic series-connected solar cell of the present invention.

The ultimate product is the monolithic series-connected cell of FIG. 2. For purposes of illustration the monolithic cell contains two individual cells 34 and 35 formed on insulating substrate 40. The cells are connected by the contact ledge interconnection schemes described above and labelled, respectively, 38 and 39. External electrical contact is made at top region contact strips 30 and 31. As an additional feature an anti-reflective coating may be applied to the surface of the monolithic cell and over the exposed p-n junction for passivation.

The process sequence of the present invention may be seen by reference to FIGS. 1-a–1-e. All process steps in this sequence are carried out at temperatures on the order of 450° C. or less. The starting material, shown in FIG. 1-a, is a fully formed single junction solar cell. Substrate 15, for example, is a semi-insulating GaAs substrate. Successive epitaxial layers 16 and 17 comprise the base and top region, respectively, of a fully formed solar cell. By this point in processing, all high temperature diffusion steps such as epitaxial growth, diffusion, and ion implantation with associated annealing or similar steps would have been completed.

Using standard photolithography, a series of breaks 19 in the uniform planar starting material of FIG. 1-a are masked and etched. The etches are selected to be compatible with the material used. For example, for gallium arsenide 3 $CH_3OH$:1 $HPO_3$:1 $H_2O_2$ may be used. See e.g., Y. Tarui et al., "Preferential Etching and Etched Profile of Gallium Arsenide", J. Electrochemical Soc., V. 118, p. 118 (1971); for silicon the following etch, generally known as CP4, may be used:

25 ml $HNO_3$
15 ml HF
15 ml $HCH_3COOH$ (acetic acid)
1 drop Br.

Figure 1D:
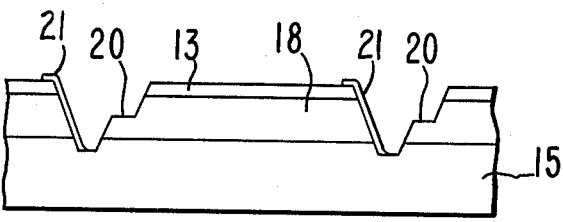
Figure 1E:
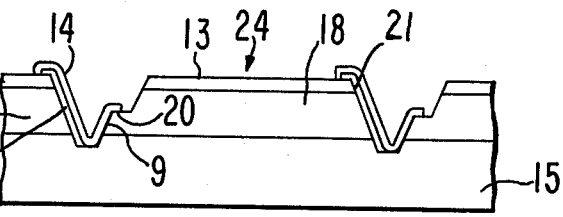

The breaks necessarily extend to or into the insulating substrate. The selection of spacing between breaks is based upon photolithographic linewidth limitations, especially those related to focusing at the groove bottom. Next, the contact ledges 20 may be produced by etching with the same etch used in forming the grooves or ion milling or plasma etching could also be employed, in which case steeper etched walls may be obtained. Finally, as set out in detail subsequently, insulating layer 21 is formed on the sidewall of the break opposite contact ledge 20, as shown in FIG. 1d, and interconnecting metallization 14 is applied thereon, as shown in FIG. 1e. The proper choice of crystal orientation using well known crystallographic criteria will assure sloping walls. The limits of photolithographic resolution are not a serious problem in the production of this ledge because it lies at a relatively shallow depth.

In a particular implementation of the fabrication sequence of the present invention to produce a four junction monolithic series-connected solar cell which had an efficiency of 13.85% the following steps were carried out:

A. PREPARATION

1. Coat fully formed solar cell wafer with 300 nm (nanometers) $SiO_2$.
2. Coat surface with black wax, leaving one small area on edge open.
3. Etch for 1.5 minutes or longer with Sirtl etch ($CrO_3$—HF) until triangular etch figures become clearly seen.
4. Remove black wax with Trichloroethylene, Acetone and Methanol.
5. Detach one corner.
6. Cleave and stain to find layer thickness and verify cleavage planes.

B. BREAK FORMATION

7. Coat with Shipley 1350J photoresist.
8. Align dark field mask with 50 micron wide bars.
9. Expose, develop, postbake 30 minutes.
10. Etch $SiO_2$ from bar areas, 2 minutes in 5:1 Allied Chemical buffered oxide etch (BOE).
11. Strip resist in Allied Chemical A-40 solvent, Acetone, Methanol, and rinse in deionized water.
12. Etch grooves with 3 Methanol:1 $H_2O_2$:1 $HPO_3$ to depth of 2 microns into the semi-insulating substrate.

C. CONTACT LEDGE FORMATION

13. Coat with Kodak 747 resist.
14. Align for n+ ledge with the clear field mask with 50 micron wide bars.
15. Expose, develop, postbake for 30 minutes.
16. Etch the $SiO_2$ from the ledge areas for 2 minutes in 5:1 BOE.
17. Strip the resist in Allied Chemical A-40 solvent, Acetone, Methanol, and rinse in deionized water.
18. Etch the n+ contact ledge with etch used in Step 12 to 3 microns below the interface between layers 17 and 16 in FIG. 1-a.

D. LAYER FORMATION OPPOSITE CONTACT LEDGE

19. Strip the $SiO_2$ from the surface of monolithic cell by one minute exposure in 5:1 BOE.
20. Rinse thoroughly in running deionized water.
21. Deposit $SiO_2$ by chemical vapor deposition for about 10 minutes at 400° C. to green-carnation color.
22. Spin on Kodak 747 resist at 3000 rpm and prebake 15 minutes.
23. Using 50 micron darkfield bar masks, expose 10 sec. to mask break wall.
24. Postbake for 30 minutes.
25. Etch the $SiO_2$ for 2 minutes in 5:1 BOE.
26. Strip the resist with Allied Chemical A-40 solvent, Acetone, Methanol, and rinse in deionized water.

E. CELL INTERCONNECTION

27. Evaporate three sequential layers with the cell-to-source angle at +50°, −50° and 0° with the following thicknesses: 10 nm, Cr, 50 nm Au-Ge, and 75 nm Au. Substrate temperature never to exceed 100° C.
28. Spin on Kodak 747 resist at 3000 rpm.
29. Expose with the darkfield bar mask to form a continuous coverage of metal from the contact ledge to the top of the p layer on the opposite side of the break.
30. Postbake for 30 minutes.
31. Etch off the Au and Au-Ge layers at 45° C. in 1:2, Aurostrip:deionized water.
32. Etch off the Cr layer in 1:1 $HCl:H_2O$, heated to about 40°–50° C. The sample surface will bubble vigorously when the Cr is attacked.
33. Remove the resist with Allied Chemical A-40 solvents, Acetone, Methanol, and rinse in deionized water.
34. Alloy for 30 seconds at 475° C.

The device fabricated in accordance with the above sequence was electrically tested after application of an anti-reflection coating of a 68.5 nm thick layer of $Si_3N_4$. The wafer was probed at points 30 and 31, shown in FIG. 2, by tungsten tipped probes. In a test conducted at Palo Alto, California at 1:30 P.M. PDT on May 15, 1979 with solar insolation of 895 watts/$m^2$ as measured with an Epply pyrheliometer, the results of Table I were obtained.

TABLE I

| ARRAY CHARACTERISTICS UNDER 819.5 W/m OF SUNLIGHT | |
|---|---|
| Open circuit voltage | V = 3.96 volts |
| Short circuit current | I = 1.01 ma. |
| Voltage at peak power | V = 2.80 volts |
| Current at peak power | I = 0.982 ma. |
| Peak power | P = 2.5 mw |
| Area | A = 0.22 cm |
| Fill factor (P/IV) | FF = 0.625 |
| Efficiency | $\eta$ = 13.85% |

An alternative embodiment of the monolithic series-connected solar cell of the present invention is shown in FIGS. 3-a–3-f. The contact ledges, such as contact ledges 50 in cell 51 or contact ledges 44 in cell 45, shown in FIG. 3-d, are not formed along the full length of the breaks between individual cells. Rather, they are formed at either end of each individual cell as shown in FIGS. 3-d and 3-e. With this arrangement there is an increase in total active solar cell area which increases cell power output even though series resistance within the cell is also increased. Another feature of the alternative embodiment is that, preferably, the epitaxial material of which the fully formed solar cell is composed has a (100) orientation along the plane of the p-n junction. Many etches, e.g., 3Methanol:1H$_2$O:1HPO$_3$, are anisotropic with respect to GaAs. Thus, the etch resistant (111) planes will become defined as the walls such as walls 55 and 56 in FIG. 3-b for the breaks. The actual width of the breaks 57 at the top of the individual cells is relatively narrow thereby further increasing active cell area. So long as isolation is effectively obtained between individual cells the breaks can be arbitrarily small since conductive metal leads need not be formed within them along their length. The processes used to define the breaks and to form the contact ledges are the same as described above with respect to the principal embodiment.

As shown in FIG. 3-f the metal interconnections are made around the periphery of the active cell area. Such an arrangement is especially suitable for concentrator configurations where the sunlight is focused on the active cell area. As known in the art, ohmic contacts to III-V materials are made preferentially by various metals to either p-type or n-type materials. See H. J. Hovel, Solar Cells (1975) p. 210. Thus, it is desirable to employ a dual metallization scheme, as shown in FIG. 3-f. To the p-type (top) portion of the cells a metal such as Au-Zn may be used whereas to the n-type (base) portion of the cells a metal such as Au-Ge or Au-Sn may be used. The overlap of the metals as at the interface between lines 48 and 49 in FIG. 3-e completes the conductive paths of the interconnections, e.g., between the top of individual cell 45 and the base of individual cell 51.

The processing sequence of the alternate embodiment is shown in FIGS. 3-a–3-f; it is carried out in the same manner as the low temperature sequence described above. The starting material, shown in FIG. 3-a, is a fully formed single junction solar cell. The subsequent process steps include anisotropic etching of the breaks, shown in side view in FIG. 3-b and in plan view in FIG. 3-c, formation of the contact ledges as by dry plasma etching or by chemical etching, shown in plan view in FIG. 3-d and in side view in FIG. 3-e, and application of the dual level metallization as by sputtering, shown in FIG. 3-e over strips 59 of insulating material such as silicon dioxide, shown in FIGS. 3e and 3f.

While the disclosure in this specification has been primarily directed to the formation of a monolithic series-connected solar cell in a III-V material the fabrication sequence and cell structure are applicable to any material for which a fully formed single junction solar cell is available that can be grown on or affixed to an insulating substrate and the scope of this invention is intended to include such materials.

I claim:

1. A monolithic series-connected solar cell having a plurality of individual cells fabricated in spaced-apart relation in semiconductor material on an insulating substrate, said individual cells being separated by breaks which extend through said semiconductor material to said insulating substrate, said individual cells being electrically interconnected in series by leads which extend from the top region of one cell to the base region of an adjacent cell, the improvement comprising:

said lead extending from the top region of one cell over an insulating layer which covers the exposed edges of said one cell to a contact ledge formed in the exposed edge of the base of an adjacent cell, said contact ledge providing a surface for positive termination of said lead.

2. A monolithic series-connected solar cell in accordance with claim 1 wherein said contact ledge is formed along the sidewall of said individual cells.

3. A monolithic series-connected solar cell in accordance with claim 1 wherein said contact ledge is formed in at least one end of said individual cells.

4. A monolithic series-connected solar cell in accordance with claim 1 wherein said top regions are p-type GaAs, said base regions are n-type GaAs and said insulating substrate is semi-insulating GaAs.

5. A monolithic series-connected solar cell in accordance with claim 1 wherein said top regions are silicon of one conductivity type, said base regions are silicon of the opposite conductivity type and said insulating substrate is sapphire.

6. A fabrication sequence for providing a monolithic series-connected solar cell from a single junction cell fully formed in semiconductor material on an insulating substrate, comprising the steps of:

providing a fully formed solar cell of semiconductor material on an insulating substrate;

forming breaks in said semiconductor material, said breaks extending to said insulating substrate to separate individual cell regions;

forming a contact ledge in the exposed edge of the base region of those individual cells which are to be electrically interconnected to the top region of adjacent cells;

forming a layer of insulating material over the exposed edges on the sidewall opposite to said contact ledges; and forming an electrically conductive interconnection lead over said layer of insulating material from the top region of said adjacent cell to said contact ledge.

7. A fabrication sequence in accordance with claim 6 wherein said step of forming a contact ledge is accomplished by the step of forming a contact ledge along the sidewall of said base region of said individual cells.

8. A fabrication sequence in accordance with claim 7 wherein said step of forming a contact ledge further includes forming a contact ledge whose surface is essentially parallel with said top regions of said adjacent cells.

9. A fabrication sequence in accordance with claim 8 wherein said step of forming an electrical interconnection lead further includes forming electrical interconnection leads which substantially cover said contact ledges.

10. A fabrication sequence in accordance with claim 6 wherein said step of forming a contact ledge is accomplished by the step of forming a contact ledge in said base region at the end of said individual cells.

* * * * *